United States Patent [19]

Bosselaers et al.

[11] Patent Number: 4,500,857
[45] Date of Patent: Feb. 19, 1985

[54] FREQUENCY MODULATED PHASE LOCKED LOOP

[75] Inventors: Robert J. Bosselaers, Winchester; Richard B. Elder, Acton, both of Mass.

[73] Assignee: The United States of America as represented by the Secretary of the Army, Washington, D.C.

[21] Appl. No.: 469,333

[22] Filed: Feb. 24, 1983

[51] Int. Cl.³ .......................................... H04L 27/12
[52] U.S. Cl. ................................. 332/9 R; 331/17; 331/23; 331/DIG. 2; 332/19; 375/120
[58] Field of Search ............ 332/9 R, 16 R, 19, 30 V; 331/17, 23; 375/45, 47, 62, 64, 65, 120

[56] References Cited

U.S. PATENT DOCUMENTS 2,968,769  1/1961  Johnson et al. ................... 332/19 X
4,068,198  1/1978  Otto ..................................... 332/19
4,068,199  1/1978  Madoff ................................ 332/19

Primary Examiner—Siegfried H. Grimm
Attorney, Agent, or Firm—Anthony T. Lane; Michael Zelenka; Jeremiah G. Murray

[57] ABSTRACT

A phase locked loop is frequency modulated by means of a modulation signal applied to the loop filter thereof. The circuit is designed with two time constants, one of which determines the square wave modulation response thereof and the other the loop settling time. Each of these time constants is chosen to optimize the loop modulation response and the loop settling time.

4 Claims, 3 Drawing Figures it, forming one input of phase detector 11. The other input of the phase detector is the reference frequency signal $f_R$. The phase detector output is applied to low pass filter 9 which applies the dc component of the phase detector output to the control input of VCO 5 to adjust the frequency and phase thereof so that the feedback loop is in balance. At balance, the VCO frequency will be N times $f_R$.

FREQUENCY MODULATED PHASE LOCKED LOOP

The Government has rights in this invention pursuant to Contract DAAB07-77-C-3298, awarded by the Department of the Army.

BACKGROUND OF THE INVENTION

The field of this invention is frequency modulated phase locked loops, and more particularly such a loop which has certain desirable characteristics when frequency modulated by digital signals wherein the oscillator of the loop may for example be frequency shift keyed between two frequencies representing the mark and space frequencies of a teletype system.

SUMMARY OF THE INVENTION

The modulation response curve of a simple phase locked loop goes to zero as the modulating frequency thereof goes to zero. Such a response will not faithfully reproduce a square wave which in necessary for the aforementioned digital modulation. A response curve with good square wave characteristics can be designed by providing the phase locked loop with a fairly low damping factor, however this low damping factor results in an undesirably long settling time when the circuitry is turned "on" and "off" for each message. In accordance with the invention, the circuit is designed with two different time constants to simultaneously achieve good square wave response for modulation and optimal loop settling time. The desired performance is achieved by inserting the digital modulation waveform at a point in the phase locked loop filter such that the desired modulation time constant is achieved while providing optimal loop settling time.

It is thus an object of the invention to provide a digitally frequency modulated phase locked loop with good square wave response and optimal settling time.

Another object of the invention is to provide an analog frequency modulated phase locked loop with good response and optimal settling time.

A further object of the invention is to provide a phase locked loop with two different time constants, one of which determines the square wave response thereof and the other of which determines the loop settling time, and wherein each of these time constants is optimized for digital square wave modulation of said loop and for short settling time.

These and other objects and advantages of the invention will become apparent from the following detailed description and the drawings.

DETAILED DESCRIPTION OF A PREFERRED EMBODIMENT

Figure 1:
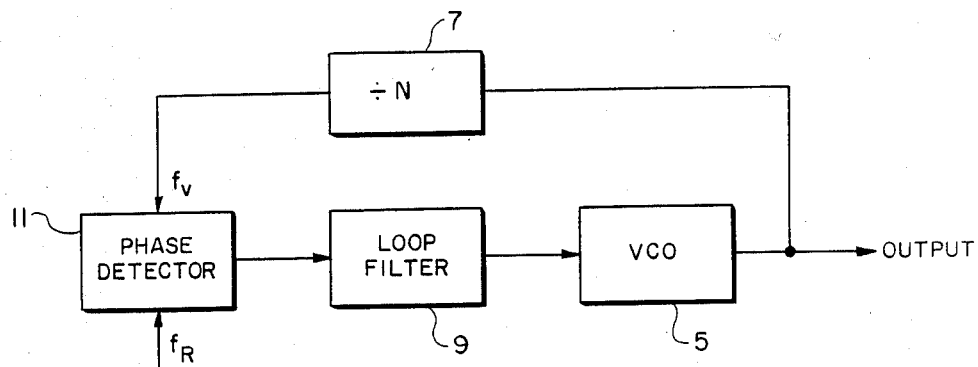
FIG. 1 is a block diagram of a conventional prior art phase locked loop.

As illustrated in FIG. 1, a phase locked loop may comprise a voltage controlled oscillator (VCO), 5, with a portion of the VCO output divided by N in a frequency divider 7 and the divided output thereof, $f_v$,  forming one input of phase detector 11. The other input of the phase detector is the reference frequency signal $f_R$. The phase detector output is applied to low pass filter 9 which applies the dc component of the phase detector output to the control input of VCO 5 to adjust the frequency and phase thereof so that the feedback loop is in balance. At balance, the VCO frequency will be N times $f_R$.

Figure 2:
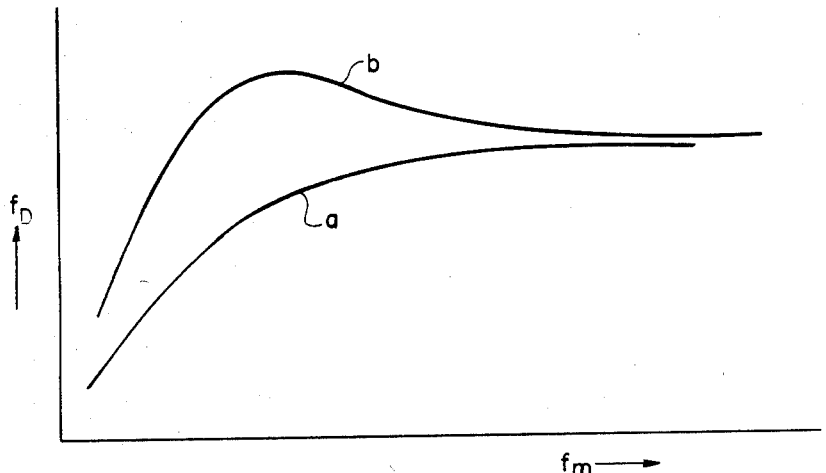
FIG. 2 shows the modulation response of phase locked loops with different time constants in the loop filters thereof.

The phase detector will provide a linear output voltage proportional to the phase difference between its input provided these inputs remain within $2\pi$ radians of each other. Thus such a phase locked loop can be frequency modulated if the modulation does not result in phase differences exceeding the aforementioned limit. The phase change in radians, $\theta$, is equal to the quotient of the frequency deviation, $f_D$, and the modulating frequency, $f_m$. This means that at the modulating frequency goes to zero, the frequency deviation also goes to zero. As a result to this, a typical modulation curve looks like curve "a" of FIG. 2. The curves of FIG. 2 represent the modulating frequency vs. the frequency deviation. A modulation characteristic such as that of "a" poses a problem when the phase locked loop is digitally frequency modulated in that the response drops off at low modulating frequencies. This response can be modified by changing the time constant of the loop filter 9 to provide lower loop damping which will result in an over-shoot at the low end of the frequency response curve. Such a controlled over-shoot is represented by curve "b" of FIG. 2.

An undesired side effect of providing the low damping factor required to improve the modulation response curve is that the settling time will necessarily be increased as the loop damping is decreased. This increased settling time means that the phase locked loop requires excessive time to come to balance after the circuitry is switched on preparatory to sending a message.

Figure 3:
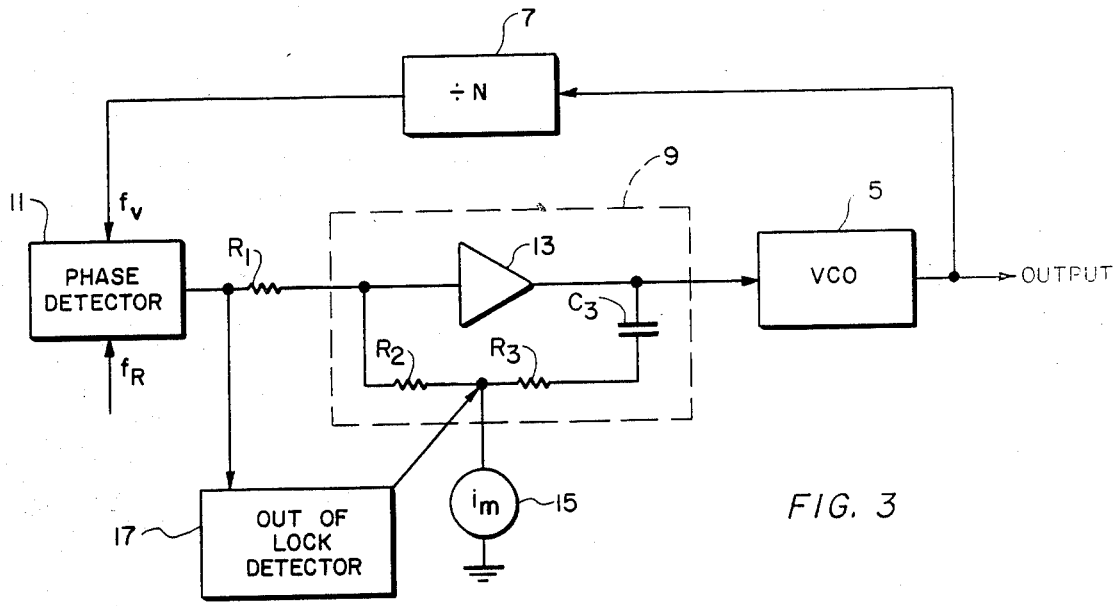
FIG. 3 is a diagram of the novel digitally modulated phase locked loop of the present invention.

These conflicting requirements are, in accordance with the invention, overcome by the use of a novel modulated phase locked loop such as shown in FIG. 3. In this diagram, the VCO, the frequency divider and the phase detector have the same reference numerals and perform the same functions as do the similar circuit elements of FIG. 1. The loop filter is shown in some detail within the dashed block 9 to show how a digital modulation signal from signal generator 15 may be inserted into the loop in such a way as to provide the required modulation response characteristic such as that the curve "b" of FIG. 2, while the time constant which determines the loop settling time will be short to provide the required short settling time. The loop filter 9 of FIG. 3 comprises a high gain direct current amplifier 13, with a feedback loop comprising resistors $R_2$ and $R_3$ in series with capacitor $C_3$, as illustrated. Such an operational amplifier comprises an integrator or a low pass filter. The digital modulation signal from 15 is inserted into the phase locked loop at the junction of the two resistors $R_2$ and $R_3$, which two resistors form the resistive portion of the integrator's feedback loop. Thus the time constant for modulation is proportional to $R_3C_3$, and this time constant is chosen to produce the desired modulation characteristic such as that of curve "b" of FIG. 2. Since the settling time of the phase locked loop is determined by the reciprocal of the total integrator time constant of $(R_2+R_3)C_3$, the circuit can be designed for any desired short loop settling time by the proper choice of $R_2$.

If an out of lock detector is used with this circuit, its signal should be inserted into the phase locked loop at the same point as is the digital modulation. Such detectors are used to speed up acquisition after an out of lock condition is sensed. Such a detector 17 is shown in FIG. 3 with its input connected to the phase detector output and its output connected to the junction of $R_2$ to $R_3$.

While the invention has been described in connection with an illustrative embodiment, obvious variations therein will occur to those skilled in the art, accordingly the invention should be limited only by the scope of the appended claims.

We claim:

1. A phase locked loop adapted for frequency modulation by means of a digital modulation signal, comprising a phase detector to which a reference signal and a signal related to the output frequency of a voltage controlled oscillator are applied, a loop filter connecting the output of said phase detector to the control input of said voltage controlled oscillator, means to apply a digital modulation signal to said loop filter in such a way that a desired modulation characteristic for square wave frequency modulation results and wherein said phase locked loop also has a time constant which results in a desired short loop settling time.

2. The circuit of claim 1 wherein said loop filter comprises an operational integrator with a feedback loop comprising two resistors and a capacitor all in series and wherein said digital modulation signal is applied to the junction of said two resistors.

3. The circuit of claim 2 wherein said resistors are represented as $R_2$ and $R_3$ and said capacitor as $C_3$, and said elements are connected in series in the order recited herein, and whereby the values of $R_3$ and $C_3$ are chosen to produce a modulation characteristic with a controlled overshoot toward the low end thereof and the values of $R_2$, $R_3$ and $C_3$ are chosen to produce a desired short settling time for said phase locked loop.

4. A digitally frequency modulated phase locked loop comprising a loop filter between the output of phase detector thereof and the voltage controlled oscillator thereof, means to apply a digital modulating signal to said loop at said loop filter so that said loop will be underdamped for said modulating signals but will also be properly damped to produce a short settling time.

* * * * *